United States Patent
Lee

(10) Patent No.: US 9,511,539 B2
(45) Date of Patent: Dec. 6, 2016

(54) LASER BEAM IRRADIATION APPARATUS AND SUBSTRATE SEALING METHOD

(71) Applicant: SAMSUNG DISPLAY CO., LTD., Yongin, Gyeonggi-Do (KR)

(72) Inventor: Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 136 days.

(21) Appl. No.: 13/857,934

(22) Filed: Apr. 5, 2013

(65) Prior Publication Data

US 2014/0174664 A1 Jun. 26, 2014

(30) Foreign Application Priority Data

Dec. 21, 2012 (KR) ........................ 10-2012-0151344

(51) Int. Cl.
*B29C 65/16* (2006.01)
*C03C 27/00* (2006.01)
*H01L 51/52* (2006.01)

(52) U.S. Cl.
CPC ........... *B29C 65/1629* (2013.01); *C03C 27/00* (2013.01); *H01L 51/5246* (2013.01)

(58) Field of Classification Search
CPC .................................................... C03C 27/00
USPC .......................................... 156/272.2, 272.8
See application file for complete search history.

(56) References Cited

U.S. PATENT DOCUMENTS

| 6,998,776 B2 | 2/2006 | Aitken et al. |
| 8,247,730 B2 | 8/2012 | Liu et al. |
| 2005/0100703 A1* | 5/2005 | Terada et al. .................. 428/57 |
| 2009/0233513 A1 | 9/2009 | Lee et al. |
| 2009/0308105 A1* | 12/2009 | Pastel et al. ...................... 65/42 |
| 2010/0154476 A1* | 6/2010 | Becken .................. C03C 27/06 65/36 |
| 2011/0080926 A1 | 4/2011 | Lee et al. |
| 2011/0115365 A1 | 5/2011 | Kwak |
| 2011/0165814 A1 | 7/2011 | Jung-Min et al. |
| 2011/0165816 A1* | 7/2011 | Lee et al. ........................ 445/25 |
| 2011/0177746 A1 | 7/2011 | Voronov et al. |
| 2012/0000611 A1 | 1/2012 | Lee et al. |

FOREIGN PATENT DOCUMENTS

| CN | 101533790 A | 9/2009 |
| CN | 102035128 A | 4/2011 |
| EP | 2 101 366 A1 | 9/2009 |

(Continued)

OTHER PUBLICATIONS

EPO Search Report dated Apr. 3, 2014, for corresponding European Patent application 13181587.0, (6 pages).

(Continued)

*Primary Examiner* — Daniel McNally
(74) *Attorney, Agent, or Firm* — Lewis Roca Rothgerber Christie LLP

(57) ABSTRACT

Provided is a laser beam apparatus for sealing a first substrate and a second substrate by irradiating a sealant between the first substrate and the second substrate using a laser beam, the laser beam apparatus including a controller, wherein the controller is configured to defocus the laser beam and to move a scanning central axis of the laser beam across a sealing path of the sealant.

11 Claims, 4 Drawing Sheets

(56) References Cited

FOREIGN PATENT DOCUMENTS

| KR | 10-2006-0005369 A | 1/2006 |
| KR | 10-2010-0072315 A | 6/2010 |
| KR | 10-2011-0080884 A | 7/2011 |
| KR | 10-2012-0019333 A | 3/2012 |

OTHER PUBLICATIONS

EPO Office action dated May 10, 2016, for corresponding European Patent application 13181587.0, (4 pages).
Chinese Office Action dated Jul. 26, 2016 of the corresponding Chinese Patent Application No. 201310365910.5, (9 pages).

* cited by examiner

LASER BEAM IRRADIATION APPARATUS AND SUBSTRATE SEALING METHOD

CROSS-REFERENCE TO RELATED PATENT APPLICATION

This application claims priority to and the benefit of Korean Patent Application No. 10-2012-0151344, filed on Dec. 21, 2012, in the Korean Intellectual Property Office, the disclosure of which is incorporated herein in its entirety by reference.

BACKGROUND

1. Field

The present invention relates to a laser beam irradiation apparatus and a substrate sealing method.

2. Description of the Related Art

Recently, portable thin-type flat display devices are increasingly being used. An electroluminescence display device, which is among the flat display devices, is a self-emissive type display device which has a wide view angle, an excellent contrast, and a quick response speed, and thus, the electroluminescence display device has attracted attention as a next-generation display device. In addition, an organic light-emitting display device in which a light-emitting layer is formed of an organic material has better characteristics in brightness, a driving voltage, and a response speed and may be polychromized when compared with a non-organic light-emitting display device.

A typical organic light-emitting display device has a structure in which at least one organic layer including a light-emitting layer is interposed between a pair of electrodes.

According to such an organic light-emitting display device, when moisture or oxygen enters into the inside from a surrounding environment, due to oxidization, exfoliation, or the like of an electrode material, the life span of an organic light-emitting device (OLED) is reduced, light-emitting efficiency is lowered, a light-emitting color is deteriorated, and other problems may occur.

Thus, when organic light-emitting display devices are manufactured, a process of sealing an OLED to prevent moisture from permeating by separating the OLED from the outside is typically performed. As a sealing method, a method of laminating a non-organic thin film and an organic polymer, such as polyester (PET), on a second electrode of an organic light-emitting display device, or a method of forming a moisture absorption material inside an encapsulation substrate, charging a nitrogen gas inside the encapsulation substrate, and sealing an edge of the encapsulation substrate with a sealant, such as epoxy, is usually used.

However, these methods cannot perfectly block OLED destructive factors, such as moisture, oxygen, or the like, introduced from the outside, and thus, it is disadvantageous to apply these methods to an organic light-emitting display device that is especially vulnerable to moisture. Furthermore, processes for realizing these methods are also complicated. To address the problems described above, a substrate sealing method for improving adhesivity between an OLED substrate and an encapsulation substrate by using a frit as a sealant has been proposed.

In this case, since perfect sealing between the OLED substrate and the encapsulation substrate is achieved by using a structure of sealing an organic light-emitting display device by coating a frit on a glass substrate, the organic light-emitting display device may be more effectively protected.

According to a method of sealing a substrate with a frit, the substrate is sealed by coating the frit on a sealing part of each organic light-emitting display device and irradiating a laser beam on the sealing part of each organic light-emitting display device while moving a laser beam irradiation apparatus to harden the frit.

SUMMARY

The present invention provides a laser beam irradiation apparatus capable of equalizing a temperature of a corner section and a substrate sealing method using the same.

According to an aspect of the present invention, there is provided a laser beam apparatus for sealing a first substrate and a second substrate by irradiating a sealant between the first substrate and the second substrate using a laser beam, the laser beam apparatus comprising a controller, wherein the controller is configured to defocus the laser beam and to move a scanning central axis of the laser beam across a sealing path of the sealant.

The controller may be configured to defocus the laser beam when the controller moves the laser beam apparatus parallel to the laser beam.

The controller may be configured to control a scan speed and a power of the laser beam.

The controller may be configured to decrease the power of the laser beam when the scan speed of the laser beam decreases and to increase the power of the laser beam when the scan speed of the laser beam increases.

The controller may be configured to decrease the scan speed and the power of the laser beam at a corner of the sealing path.

The controller may be configured to operate at a corner of the sealing path.

When the controller operates at the corner of the sealing path, an intensity of the laser beam at the corner of the sealing path gradually increases from a first region of the sealing path to a second region of the sealing path.

The intensity of the laser beam in the second region may be double the intensity of the laser beam in the first region.

The laser beam may comprise a spot beam.

A diameter of the spot beam may be substantially the same as a width of the sealant or is equal to or less than double the width of the sealant.

According to another aspect of the present invention, there is provided a substrate sealing method including aligning a central axis of a laser beam to a central line of a sealing path, scanning the laser beam along the central line of the sealing path to irradiate the sealing path with the laser beam, defocusing the laser beam, and moving a scanning central line of the laser beam in a direction crossing the sealing path.

The defocusing may include moving the scanning central line of the laser beam towards an outer edge of the sealing path.

The substrate sealing method may further include changing a scan speed of the laser beam.

The substrate sealing method may further include changing a power of the laser beam.

The substrate sealing method may further include changing a scan speed of the laser beam, and changing a power of the laser beam.

The changing the scan speed may include decreasing the scan speed of the laser beam, and the changing the power may include decreasing the power of the laser beam.

The aligning, the scanning, the defocusing, and the moving may be performed at a corner of the sealing path The intensity of the laser beam at the corner of the sealing path may gradually increase from a first region of the sealing path to a second region of the sealing path.

The intensity of the laser beam in the second region may be double the intensity of the laser beam in the first region.

Operations the defocusing and the moving may be performed at a corner of the sealing path.

The laser beam may include a spot beam.

A width of the laser beam may be wider than a width of the sealing line.

The substrate sealing method may further include focusing the laser beam, and aligning the scanning central line of the laser beam to the central line of the sealing path.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention may allow various kinds of changes or modifications and various changes in form, and specific embodiments will be illustrated in drawings and described in detail in the specification. However, it should be understood that the specific embodiments do not limit the present invention to a specific disclosing form but include every modified, equivalent, or replaced embodiment within the spirit and technical scope of the present invention. In the following description, well-known functions or constructions are not described in detail since they would obscure the invention with unnecessary detail.

Although terms, such as 'first' and 'second', can be used to describe various elements, the elements should not be limited by the terms. The terms can be used to classify a certain element from another element.

The terminology used in the application is used only to describe specific embodiments and does not have any intention to limit the present invention. An expression in the singular includes an expression in the plural unless they are clearly different from each other in a context. In the application, it should be understood that terms, such as 'include' and 'have', are used to indicate the existence of an implemented feature, number, step, operation, element, part, or a combination of them without excluding in advance the possibility of existence or addition of one or more other features, numbers, steps, operations, elements, parts, or combinations of them.

Hereinafter, the present invention will be described more fully with reference to the accompanying drawings, in which exemplary embodiments of the invention are shown.

Figure 1:
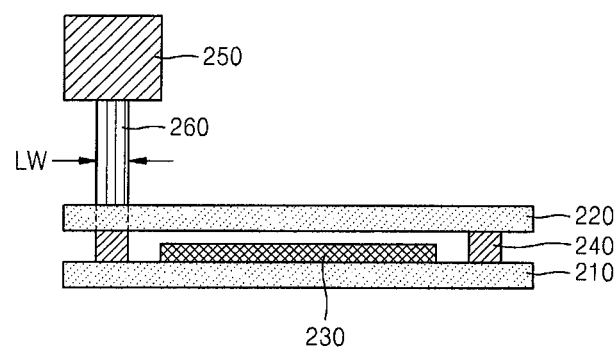
FIG. 1 is a cross-sectional view of an organic light-emitting display device for describing a method of sealing a sealing part of the organic light-emitting display device by using a laser beam irradiation apparatus according to an embodiment of the present invention.
Figure 2:
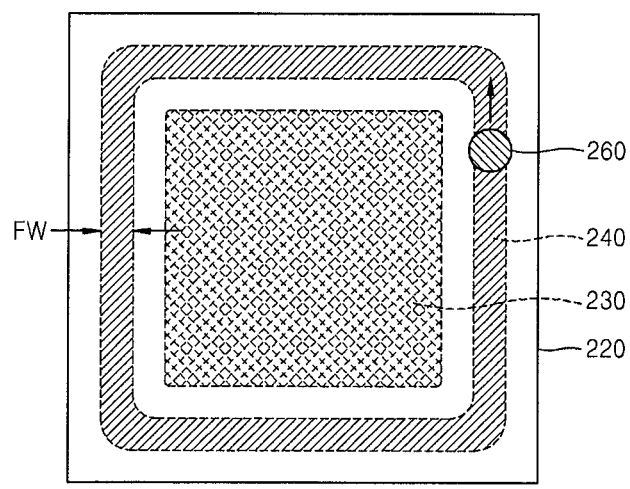
FIG. 2 is a top view of the sealing part of FIG. 1.

FIG. 1 is a cross-sectional view of an organic light-emitting display device for describing a method of sealing a sealing part (or sealant) 240 of the organic light-emitting display device by using a laser beam irradiation apparatus (or laser beam apparatus) 250 according to an embodiment of the present invention, and FIG. 2 is a top view of the organic light-emitting display device of FIG. 1.

Referring to FIGS. 1 and 2, an organic light-emitting unit (or organic light emitter) 230 and the sealing part 240 surrounding the organic light-emitting unit 230 are arranged between a first substrate 210 and a second substrate 220, and the sealing part 240 is irradiated by a laser beam 260 emitted from the laser beam irradiation apparatus 250.

The organic light-emitting unit 230 is formed on the first substrate 210. The first substrate 210 may be a glass-material substrate.

The second substrate 220 is an encapsulation substrate for encapsulating the organic light-emitting unit 230 formed on the first substrate 210 and may be a glass-material substrate through which the laser beam 260 to be described below can be transmitted.

The organic light-emitting unit 230 may include at least one organic light-emitting device (OLED: not shown) in which at least one organic layer (not shown) including a light-emitting layer is interposed between a first electrode (not shown) and a second electrode (not shown). The first electrode and the second electrode may function as an anode for injecting holes and a cathode for injecting electrons, respectively.

The OLED may be classified into a passive matrix (PM) type or an active matrix (AM) type according to whether or not a thin film transistor (TFT) controls driving of the OLED. The current embodiment is applicable to any of the AM type and/or the PM type.

The sealing part 240 is formed on the second substrate 220 at a location corresponding to a location surrounding the organic light-emitting unit 230 described above.

The sealing part 240 may form a closed loop to block contact between the organic light-emitting unit 230 and external moisture or oxygen.

Although FIG. 2 shows that each of the corner parts of the sealing part 240 forming a closed loop is formed by a curve having a curvature, the present invention is not limited thereto. That is, each of the corner parts of the sealing part 240 may form a perpendicular shape without a curvature.

When each of the corner parts of the sealing part 240 has the curvature, the sealing part 240 may be irradiated by the laser beam 260 while the laser beam 260 continuously and directly scans the sealing part 240 with a head (not shown) including an optical system (not shown) in the laser beam irradiation apparatus 250 so that the laser beam 260 is emitted along a sealing line (or sealing path) including the corners of the sealing part 240.

When each of the corner parts of the sealing part 240 is perpendicular, after the laser beam 260 is emitted while scanning the sealing part 240 with the head of the laser beam irradiation apparatus 250 in a first direction towards a first corner of the sealing part 240, a stage (not shown) arranged below the first substrate 210 may be rotated by 90°. When the stage is rotated, the first substrate 210 and the second substrate 220 are also rotated together with the stage. After the rotation of the stage, while scanning the sealing part 240 in the first direction the sealing part is irradiated using the laser beam 260, such that a second corner of the sealing part 240 is irradiated by the laser beam 260. In this manner, the sealing part 240 may be sealed by a method of irradiation using the laser beam 260 while rotating the stage.

In the current embodiment, to more effectively protect the organic light-emitting unit 230 by securing airtightness of the first substrate 210 and the second substrate 220, a frit may be used as the sealing part 240. The frit may be formed to have a frit width (e.g., a predetermined frit width) FW by various methods, such as a screen printing method, a pen dispensing method, and so forth.

Although the first substrate 210 and the second substrate 220 are aligned by forming the sealing part 240 on the second substrate 220 and forming the organic light-emitting unit 230 on the first substrate 210 in the current embodiment, the present invention is not limited thereto. For example, the sealing part 240 may be formed on the first substrate 210 on which the organic light-emitting unit 230 has been formed, aligned with the second substrate 220, and bonded with the second substrate 220.

In addition, although FIGS. 1 and 2 show a case where one organic light-emitting unit 230 is included, the present invention may be applicable to a case where a plurality of organic light-emitting units 230 and a plurality of sealing parts 240 surrounding the plurality of organic light-emitting units 230 are included between the first substrate 210 and the second substrate 220.

The laser beam irradiation apparatus 250 emits the laser beam 260 in the form of a spot beam having a beam profile according to an embodiment of the present invention on the sealing part 240 arranged between the first substrate 210 and the second substrate 220 along the sealing line. A diameter of the spot beam may be substantially the same as a width of the sealing part 240 or may be equal to or less than double the width of the sealing part 240.

Although not shown in detail, the laser beam irradiation apparatus 250 may include a laser oscillator (not shown) for generating laser, a beam homogenizer (not shown), a scanner (not shown), and so forth.

As for the laser oscillator, a bundle-type multi-core source that is a high-power laser source generally used for laser sealing may be used.

In such a bundle-type multi-core source, because output power of each core may somewhat vary, this non-uniformity may be solved by using the beam homogenizer.

The scanner may include a reflection unit or reflector (not shown) for reflecting the laser beam 260 emitted by the laser oscillator to irradiate the sealing part 240 by the laser beam 260, a driving unit or driver (not shown) for driving the reflection unit, a lens unit (not shown) for concentrating the reflected laser beam 260, and so forth.

The laser beam 260 output from the lens unit is emitted on the sealing part 240 in the form of a spot beam having a beam profile according to the current embodiment. In this case, the lens unit may be located (or disposed) inside the scanner or be separately located (or disposed) below the scanner to face the sealing part 240.

Although not shown, when a width LW of the laser beam 260 emitted by the laser beam irradiation apparatus 250 is wider than a width FW of the sealing part 240, a laser mask (not shown) may be disposed between the laser beam irradiation apparatus 250 and the second substrate 220 to adjust the width LW of the laser beam 260 emitted on the width FW of the sealing part 240.

Figure 3:
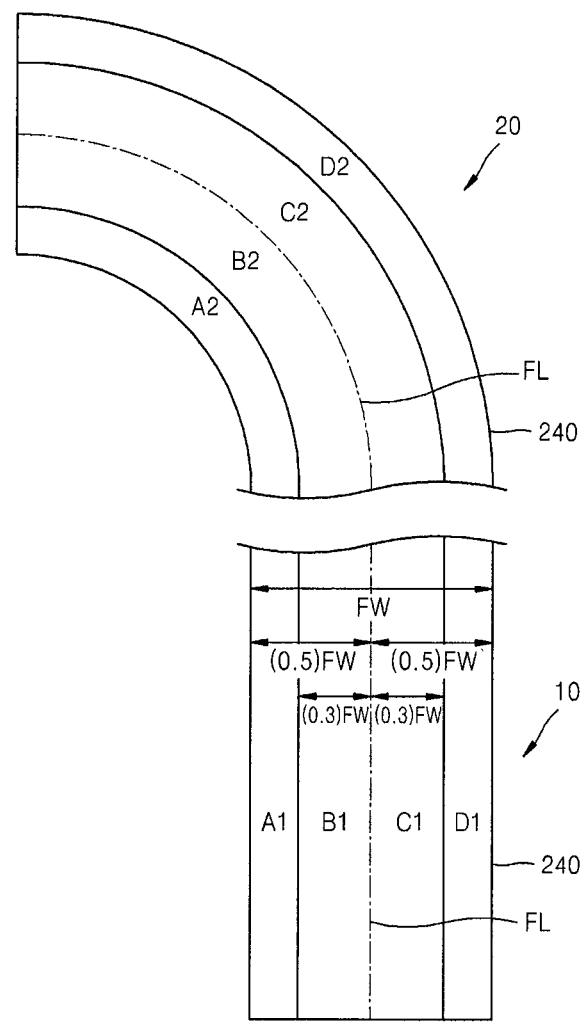
FIG. 3 is a top view of the sealing part in a direct-line region and a corner region according to an embodiment of the present invention.
Figure 4:
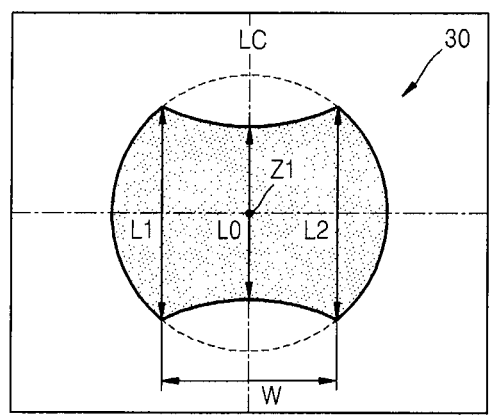
FIG. 4 is a cross-sectional view of a beam in the direct-line region according to an embodiment of the present invention.

FIG. 3 is a top view of the sealing part 240 in a direct-line region 10 and a corner region 20, and FIG. 4 is a cross-sectional view of a beam 30 in the direct-line region 10, according to an embodiment of the present invention.

The sealing part 240 in the direct-line region 10 is divided into a fifth region A1 having a width of 0.2 times the width FW of the sealing part 240 extending from the inner edge of the sealing part 240, a seventh region B1 having a width of 0.3 times the width FW of the sealing part 240 extending inwards from a sealing line FL, an eighth region C1 having a width of 0.3 times the width FW of the sealing part 240 extending outwards from the sealing line FL, and a sixth region D1 having a width of 0.2 times the width FW of the sealing part 240 extending from the outer edge of the sealing part 240.

Likewise, the sealing part 240 in the corner region 20 is divided into a first region A2 having a width of 0.2 times the width FW of the sealing part 240 extending from the inner edge of the sealing part 240, a third region B2 having a width of 0.3 times the width FW of the sealing part 240 extending inwards from the sealing line FL, a fourth region C2 having a width of 0.3 times the width FW of the sealing part 240 extending outwards from the sealing line FL, and a second region D2 having a width of 0.2 times the width FW of the sealing part 240 extending from the outer edge of the sealing part 240.

A sealing process in the direct-line region 10 is first described. Because heat may tend to leak more to the outside along the edge part of the sealing part 240 than from along the center part of the sealing part 240, energy greater than that for the center part of the sealing part 240 may be supplied to the edge part of the sealing part 240 to make a temperature distribution uniform along a cross section of the sealing part 240 after a laser beam is emitted. Thus, a region may be irradiated by the laser beam that is 60% inside the sealing part 240 with the intensity lower by 30% than that of the edge part of the sealing part 240.

That is, in the direct-line region 10, if it is assumed that the intensity of the laser beam is 100% in the fifth region A1, the intensities of the laser beam in the seventh and eighth regions B1 and C1 may be 70%, and the intensity of the laser beam in the sixth region D1 may be 100%. However, the present invention is not limited thereto.

Referring to FIG. 4, the beam 30 has substantially constant beam intensity (e.g., has substantially constant beam intensity over the entire beam) and has a beam profile of a symmetrical shape about a beam center line LC with two recessed sides. In addition, a center line length L0 of the beam 30 is formed to be shorter than each of lengths L1 and L2 of the beam's circumferential parts, which are parallel to the beam center line LC.

Thus, the sealing part 240 may be sealed by substantially matching a width W of a recessed region of the beam 30 with the width FW of the sealing line. In this case, a heat flux, which is an integral value of laser beam intensity emitted while scanning the sealing part 240 along the center line FL of the sealing line with respect to a time, may have a greater value at the edge part of the sealing part 240 than at the center part of the sealing part 240.

Thus, if the beam 30 having the beam profile as described above in the direct-line region 10 is emitted on the sealing part 240 of the organic light-emitting display device, energy greater than that for the center part of the sealing part 240 may be supplied to the edge part of the sealing part 240, thereby improving temperature uniformity of a cross section of the frit.

However, in the corner region 20, when scanning is performed using a beam having the constant beam intensity as shown in the beam shape of FIG. 4, there occurs a phenomenon that a temperature of an inner region of the corner region 20 is much higher than a temperature of an outer region of the corner region 20. Main reasons of the phenomenon are firstly because an inner radius of the corner region 20 is less than an outer radius of the corner region 20 and secondly because a circumference part acting as a heat sink is larger at the outer edge of the corner region 20 than at the inner edge of the corner region 20.

Thus, a phenomenon, such as damage due to a high temperature or wiring damage inside the corner region 20, may occur due to non-uniform temperatures in the inner region and the outer region of the corner region 20. In addition, the outer edge of the corner region 20 may not be properly melted, thereby resulting in a decrease in a sealing width or the occurrence of a crack.

Thus, referring to FIG. 3, in the corner region 20, energy greater than that for the inner part of the sealing part 240 may be supplied to the outer part of the sealing part 240 to make a temperature distribution uniform along a cross section of the sealing part 240 after the laser beam is emitted. Thus, the laser beam may be emitted in the corner region 20 so that the intensity of the laser beam gradually increases from the inner part of the corner region 20 to the outer part thereof.

That is, in the direct-line region 10, if it is assumed that the intensity of the laser beam is 100% in the fifth region A1, the intensities of the laser beam in the first region A2, the third region B2, the fourth region C2, and the second region D2 may be 60%, 80%, 100%, and 120%, respectively. However, the present invention is not limited thereto.

A method of irradiating a laser beam with differentiated intensities as described above in the corner region 20 will now be described.

Figure 5:
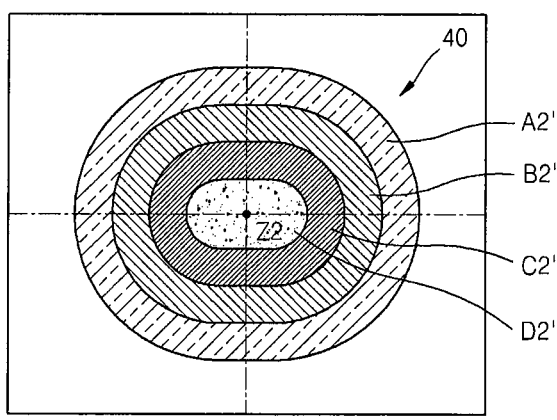
FIG. 5 is a cross-sectional view of a defocused beam according to an embodiment of the present invention.
Figure 6:
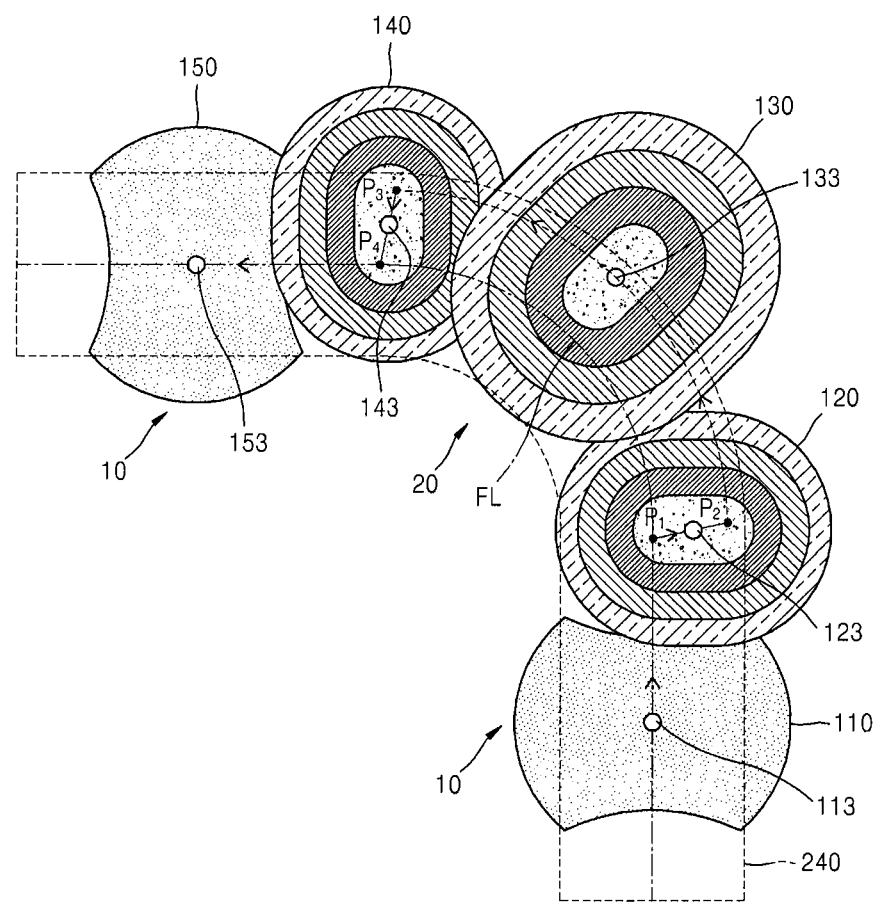
FIG. 6 is a top view of the sealing part for describing a sealing process in the direct-line region and the corner region according to an embodiment of the present invention.

FIG. 5 is a cross-sectional view of a defocused beam 40 according to an embodiment of the present invention, and FIG. 6 is a top view of the sealing part 240 for describing a sealing process in the direct-line region 10 and the corner region 20, according to an embodiment of the present invention.

Referring to FIG. 5, the intensity of the defocused beam 40 becomes gradually weaker outwards a center axis Z2.

The laser beam irradiation apparatus 250 may emit the laser beam 260 in a method of focusing the laser beam 260 on the frit 240 or the second substrate 220. Thus, the laser beam 260 may be defocused by moving the laser beam irradiation apparatus 250 in a direction parallel to the laser beam 260. That is, the laser beam 260 may be defocused by moving the laser beam irradiation apparatus 250 in a direction perpendicular to the second substrate 220.

The laser beam irradiation apparatus 250 may include a controller (not shown) for controlling a focus of the laser beam 260 and a traveling direction of the laser beam irradiation apparatus 250. Thus, the laser beam 260 may be defocused under control of the controller. Further, the controller may control the laser beam 260 to be defocused by controlling the movement of the laser beam irradiation apparatus 250 in the direction parallel to the laser beam 260. As an embodiment, the laser beam 260 may be defocused by lifting the laser beam irradiation apparatus 250 by 20 mm in the direction parallel to the laser beam 260, and in this case, an image size may also increase by 17%.

Referring to FIG. 5, the intensity of the defocused beam 40 becomes gradually weaker outwards the center axis Z2, and the defocused beam 40 may have an energy profile having a similar shape as a Gaussian function.

The defocused beam 40 may be divided into a second region D2' including the center axis Z2, a fourth region C2' surrounding the second region D2', a third region B2' surrounding the fourth region C2', and a first region A2' surrounding the third region B2'.

The beam intensity becomes gradually weaker in the order of the second region D2', the fourth region C2', the third region B2', and the first region A2'. In addition, the beam intensity in the first region A2' may be 50% or less of the beam intensity in the second region D2'.

Referring to FIG. 6, the laser beam irradiation apparatus 250 emits a laser beam by scanning the direct-line region 10 and the corner region 20.

A laser beam 110 in the direct-line region 10 moves to the corner region 20. As described above, in the direct-line region 10, a center axis 113 of the laser beam 110 is aligned with the center line FL of the sealing line, and the laser beam 110 is emitted by scanning the direct-line region 10 along the center line FL of the sealing line.

When the center axis 113 of the laser beam 110 arrives at a start point P1 of the corner region 20, a laser beam 120 is defocused while moving the laser beam 120 towards the outer edge of the sealing line. The laser beam 120 is defocused while moving from the start point P1 of the corner region 20 to a defocus end point P2. In addition, this operation is controlled by the controller (not shown) for controlling a focus and a traveling direction of the laser beam 120. As described above, the laser beam 120 may be defocused by moving the laser beam irradiation apparatus 250 in a direction parallel to a center axis 123 of the laser beam 120. In conclusion, the laser beam 120 ends the defocusing at the defocus end point P2.

The laser beam 120 may be moved from the start point P1 of the corner region 20 to the defocus end point P2 by moving a sub-stage holding the laser beam irradiation apparatus 250 along an x-axis and a y-axis. In one embodiment, a moving value of the x-axis may be in a range from about 0.8 mm to about 0.9 mm, and a moving value of the y-axis may be about 0.5 mm or less. Because the laser beam irradiation apparatus 250 may move along the x-axis, the y-axis, and a z-axis when the laser beam irradiation apparatus 250 moves from the direct-line region 10 to the corner region 20, the movement of the sub-stage holding the laser beam irradiation apparatus 250 may be accurately controlled along all the x-axis, the y-axis, and the z-axis by the controller.

A completely defocused laser beam 130 moves along the outer edge of the sealing line in the corner region 20. That is, the completely defocused laser beam 130 moves from the defocus end point P2 to a focus start point P3.

The completely defocused laser beam 130 may have beam intensity that is gradually weaker outwards a center axis 133 and may have an energy profile in a similar shape to a Gaussian function. Thus, while the center axis 133 of the completely defocused laser beam 130 is moving along the outer edge of the corner region 20, the laser beam 130 may be emitted so that the intensity of the laser beam 130 gradually increases from the inner edge of the corner region 20 to the outer edge thereof.

Referring to FIGS. 3 and 5, the defocused beam 40 may be emitted so that the second region D2', the fourth region C2', the third region B2', and the first region A2' of the defocused beam 40 shown in FIG. 5 correspond to the second region D2, the fourth region C2, the third region B2, and the first region A2 of the corner region 20 shown in FIG. 3, respectively.

Thus, when the beam intensities of the second region D2', the fourth region C2', the third region B2', and the first region A2' of the defocused beam 40 shown in FIG. 5 are relatively 120%, 100%, 80%, and 60%, respectively, the beam intensities in the second region D2, the fourth region C2, the third region B2, and the first region A2 of the corner region 20 shown in FIG. 3 may be 120%, 100%, 80%, and 60%, respectively. Of course, this method is applicable to the completely defocused laser beam 130 and the corner region 20 of the sealing line on which the completely defocused laser beam 130 is emitted in the same manner.

In conclusion, a temperature distribution on a cross section of the sealing part 240 after the laser beam 260 is emitted may be uniform in the corner region 20 by irradiating the laser beam 260 in the corner region 20 so that the intensity of the laser beam 260 gradually increases from the inner edge of the corner region 20 to the outer edge thereof to supply greater energy to the outer edge of the corner region 20 than energy supplied to the inner edge of the corner region 20. Thus, when a display device is sealed in the method according to the current embodiment, solidity and an adhesive strength of the display device may be improved.

Referring back to FIG. 6, when the center axis 133 of the completely defocused laser beam 130 arrives at the focus start point P3, the laser beam 130 is focused while moving to the center line FL of the sealing line. A laser beam 140 is focused by moving from the focus start point P3 to a start point P4 of the direct-line region 10. This operation is controlled by the controller for controlling a focus and a traveling direction of the laser beam 140. The laser beam 140 may be focused by moving the laser beam irradiation apparatus 250 in a direction parallel to a center axis 143 of the laser beam 140. In conclusion, the laser beam 140 ends the process of focusing at the start point P4 of the direct-line region 10.

The laser beam 140 may be moved from the focus start point P3 to the start point P4 of the direct-line region 10 by moving the sub-stage holding the laser beam irradiation apparatus 250 along the x-axis and the y-axis. In an embodiment a moving value of the x-axis may be about 0.5 mm or less, and a moving value of the y-axis may be in a range from about 0.8 mm to about 0.9 mm. Because the laser beam irradiation apparatus 250 may move along the x-axis, the y-axis, and the z-axis when the laser beam irradiation apparatus 250 moves from the corner region 20 to the direct-line region 10, the movement of the sub-stage holding the laser beam irradiation apparatus 250 may be accurately controlled along all the x-axis, the y-axis, and the z-axis by the controller.

A completely focused laser beam 150 moves along the direct-line region 10 from the start point P4 of the direct-line region 10. As described above, in the direct-line region 10, a center axis 153 of the laser beam 150 is aligned with the center line FL of the sealing line, and the laser beam 150 is emitted by scanning the direct-line region 10 along the center line FL of the sealing line.

In an embodiment, a scan speed of the laser beam irradiation apparatus 250 may be about 10 mm/s. Thus, when scanning is performed at a speed of 10 mm/s, if a curvature radius of the corner region 20 is 2 mm, about 0.3 seconds are taken to scan one corner region 20. However, a driving unit may be overloaded to perform the defocusing and the track change described above during this short time.

Thus, a scan speed in the corner region 20 may be less than a scan speed in the direct-line region 10. In an embodiment, a scanning time of one corner region 20 may be 3 seconds or more by reducing the scan speed in the corner region 20 to 1/10 the scan speed in the direct-line region 10.

The scan speed of the laser beam irradiation apparatus 250 may be controlled by the controller.

However, when the scan speed in the corner region 20 is reduced as described above, and sealing is performed with existing energy, more than required heat may be added, thereby resulting in a problem that a frit line is broken. Thus, when the scan speed in the corner region 20 is reduced, laser power may also be properly reduced. A correlation between a scan speed V and laser power P is represented by Equation 1, wherein C is a constant number.

$$\frac{P}{\sqrt{V}} = C \qquad (1)$$

Thus, if the scan speed in the corner region 20 is reduced to 10% of the scan speed in the direct-line region 10, the laser power in the corner region 20 may be reduced to 31.6% of laser power in the direct-line region 10.

However, referring to FIG. 3, the intensity of the laser beam in the outermost region of the corner region 20, i.e., the second region D2, may be 120% of the intensity of the laser beam in the outer region of the direct-line region 10, i.e., the sixth region D1. Thus, if the scan speed in the corner region 20 is reduced to 10% of the scan speed in the direct-line region 10, the laser power in the corner region 20 may be reduced to 37.9% of the laser power in the direct-line region 10.

The power of the laser beam irradiation apparatus 250 described above may be controlled by the controller.

According to the one or more embodiments of the present invention, when a laser beam is emitted on a frit of a display device, solidity and an adhesive strength of the display device may be improved.

Since the components shown in the drawings may be magnified or contracted for convenience of description, the present invention is not limited to magnitudes or shapes of the components shown in the drawings, and it will be understood by those of ordinary skill in the art that various changes in form and details may be made therein without departing from the spirit and scope of the present invention as defined by the following claims and equivalents thereof.

What is claimed is:

1. A substrate sealing method comprising:
   aligning a central axis of a focused laser beam to a central line of a sealing path;
   scanning the laser beam along the central line of the sealing path to irradiate the sealing path with the laser beam;
   defocusing the laser beam at a corner of the sealing path;
   changing a scan speed of the laser beam at the corner of the sealing path;
   changing a power of the laser beam;
   moving the central axis of the laser beam in a direction crossing the sealing path while the defocusing occurs; and
   refocusing the laser beam after passing the corner of the sealing path.

2. The substrate sealing method of claim 1, wherein the changing the scan speed comprises decreasing the scan speed of the laser beam, and the changing the power comprises decreasing the power of the laser beam.

3. The substrate sealing method of claim 2, wherein at least some of the aligning, the scanning, the defocusing, and the moving are performed at the corner of the sealing path.

4. The substrate sealing method of claim 3, wherein an intensity of the laser beam at the corner of the sealing path gradually increases from a first region of the sealing path to a second region of the sealing path.

5. The substrate sealing method of claim 4, wherein the intensity of the laser beam in the second region is greater than the intensity of the laser beam in the first region.

6. A substrate sealing method comprising:
aligning a central axis of a focused laser beam to a central line of a sealing path;
scanning the laser beam along the central line of the sealing path to irradiate the sealing path with the laser beam;
defocusing the laser beam at a corner of the sealing path;
changing a scan speed of the laser beam at the corner of the sealing path;
moving the central axis of the laser beam in a direction crossing the sealing path while the defocusing occurs; and
refocusing the laser beam after passing the corner of the sealing path.

7. The substrate sealing method of claim 6, wherein the moving is performed at the corner of the sealing path.

8. The substrate sealing method of claim 6, wherein the laser beam comprises a spot beam.

9. The substrate sealing method of claim 6, wherein a width of the laser beam is wider than a width of the sealing path.

10. The substrate sealing method of claim 6, further comprising, after the refocusing:
aligning the central axis of the laser beam to the central line of the sealing path.

11. The substrate sealing method of claim 6, wherein the central axis of the laser beam is moved towards an outer edge of the sealing path.

* * * * *